(12) United States Patent
Jeon et al.

(10) Patent No.: US 7,863,676 B2
(45) Date of Patent: Jan. 4, 2011

(54) SEMICONDUCTOR DEVICES AND METHODS OF FABRICATING THE SAME

(75) Inventors: Sang-Hun Jeon, Yongin-si (KR); Jung-Dal Choi, Suwon-si (KR); Chang-Seok Kang, Seongnam-si (KR); Won-Seok Jung, Yongin-si (KR)

(73) Assignee: Samsung Electronics Co. Ltd., Suwon-si, Gyeonggi-do (KR)

( * ) Notice: Subject to any disclaimer, the term of this patent is extended or adjusted under 35 U.S.C. 154(b) by 931 days.

(21) Appl. No.: 11/709,814

(22) Filed: Feb. 23, 2007

(65) Prior Publication Data

US 2008/0093656 A1   Apr. 24, 2008

(30) Foreign Application Priority Data

Oct. 20, 2006   (KR) .................. 10-2006-0102566

(51) Int. Cl.
   *H01L 29/66* (2006.01)
(52) U.S. Cl. .................. 257/331; 257/316; 257/319; 257/E29.129; 257/E27.103; 257/E21.645; 438/259; 438/270; 438/279
(58) Field of Classification Search .................. 257/330, 257/331, 296, 316, 319, E29.129, E27.103, 257/E21.645; 438/259, 270, 279, FOR. 212
   See application file for complete search history.

(56) References Cited

U.S. PATENT DOCUMENTS

| 4,964,080 A | 10/1990 | Tzeng |
| 5,429,971 A * | 7/1995 | Yang .......................... 438/258 |
| 7,084,477 B2 | 8/2006 | Ishitsuka et al. |
| 7,332,755 B2 * | 2/2008 | Jang et al. .................... 257/288 |
| 7,547,943 B2 * | 6/2009 | Cho et al. .................... 257/326 |
| 2006/0029887 A1 | 2/2006 | Oh et al. |
| 2006/0060910 A1 | 3/2006 | Yang et al. |
| 2006/0222966 A1 | 10/2006 | Seo et al. |
| 2008/0315285 A1* | 12/2008 | Lee et al. .................... 257/316 |
| 2009/0200596 A1* | 8/2009 | Sim et al. .................... 257/316 |

FOREIGN PATENT DOCUMENTS

| KR | 10-2004-0000352 A | 1/2004 |
| KR | 10-2006-0013122 A | 2/2006 |
| KR | 10-2006-0038620 A | 5/2006 |
| KR | 10-2006-0075240 | 7/2006 |
| KR | 10-2006-0105146 A | 10/2006 |

* cited by examiner

*Primary Examiner*—Matthew S Smith
*Assistant Examiner*—Quovaunda Jefferson
(74) *Attorney, Agent, or Firm*—Lee & Morse, P.C.

(57) ABSTRACT

A semiconductor device includes a device isolation layer in a semiconductor substrate, an active region defined by the device isolation layer, the active region including a main surface and a recess region including a bottom surface that is lower than the main surface, and a gate electrode formed over the recess region, wherein a top surface of the device isolation layer adjacent to the recess region is lower than the bottom surface of the recess region.

13 Claims, 16 Drawing Sheets

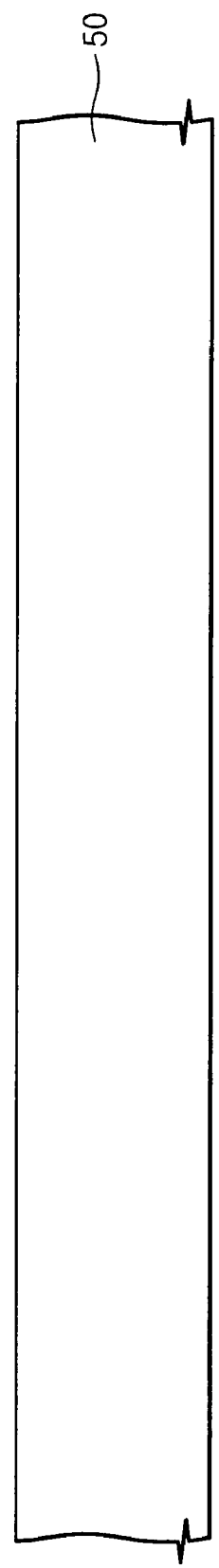

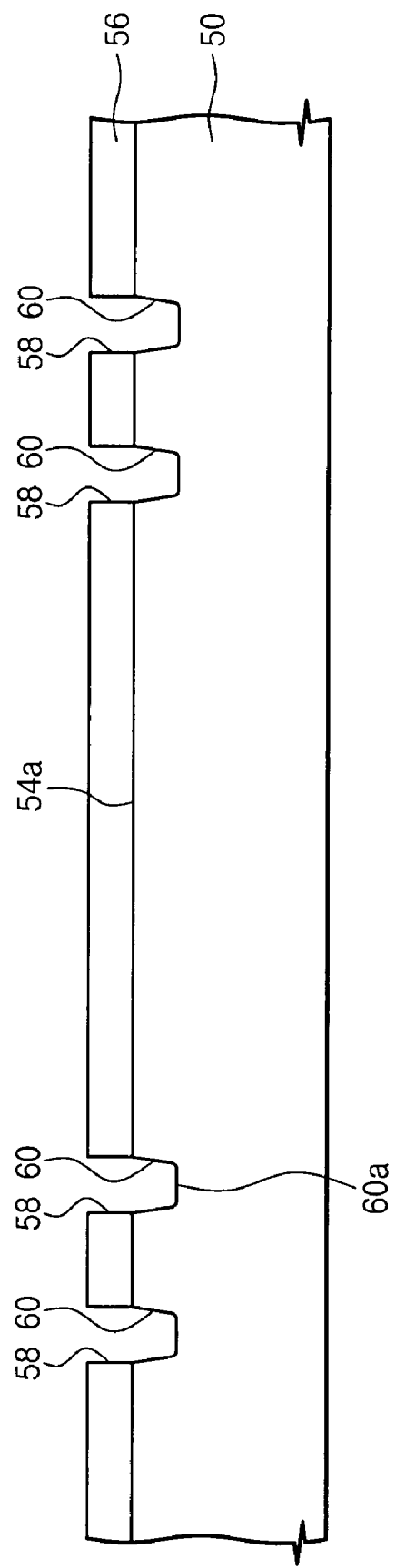

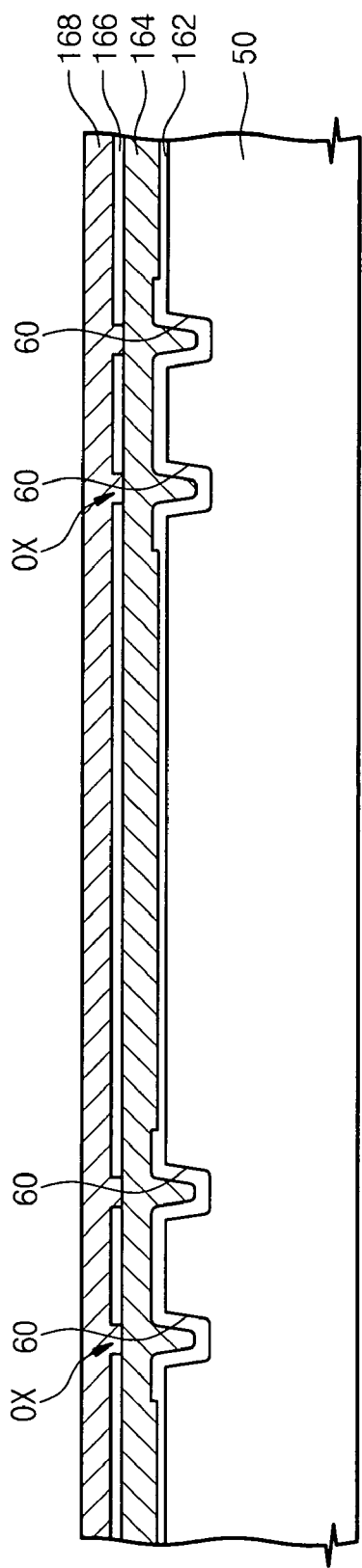

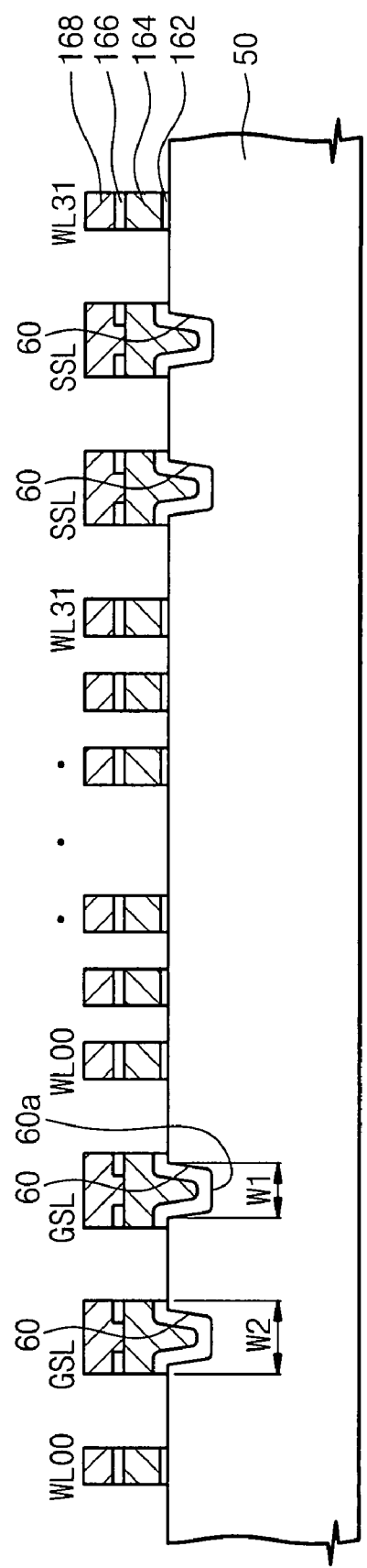

SEMICONDUCTOR DEVICES AND METHODS OF FABRICATING THE SAME

BACKGROUND OF THE INVENTION

1. Field of the Invention

The present invention disclosed herein relates to semiconductor devices and methods of fabricating the same. More particularly, the invention relates to semiconductor devices having a transistor with an extended channel width and methods of fabricating the same.

2. Description of the Related Art

As semiconductor memory devices are becoming smaller and/or more highly-integrated, a channel length and width of transistors included therein are becoming smaller. A line-width of an active region corresponding to the channel width of the transistor is also being reduced.

In general, a memory device for storing information may include a cell array with patterns having minimum line-widths. In a cell array region of the memory device, an active region and a device isolation region may be formed such that they have minimum line-widths corresponding to a gate pattern of a transistor.

However, as line-width(s) of the gate pattern(s) are reduced, a sufficient channel length should be provided in order to suppress and/or prevent short channel effect and leakage current. A structure in which an effective channel length of the transistor is increased by, e.g., etching a portion of the active region to form a recess region has been developed. In such cases, the channel length may be secured without increasing a gate line-width by forming the channel of the transistor in the recess region.

However, in such cases, problems may occur, e.g., the recess region may be filled with a gate insulating layer, and/or it may be difficult to secure an effective channel width because the channel is formed in a portion of the recess region. When the effective channel length is not sufficiently secured, a driving current may be decreased and a gate controllability of the transistor may be lowered, which may negatively impact leakage current and threshold voltage characteristics.

Flash memory devices may employ a method of forming a channel of a selection transistor in a recess region in order to suppress and/or prevent gate-induced drain leakage (GIDL) and punchthrough, and to avoid program/erase errors of an outermost cell transistor of a cell string. However, if minimum line-widths are reduced in order to provide highly-integrated devices, e.g., to about or less than about two times a thickness of a gate insulating layer, the gate insulating layer may completely fill the recess region. Thus, gate controllability of the transistor may be degraded, which may cause the transistor to operate abnormally.

SUMMARY OF THE INVENTION

The present invention is therefore directed to semiconductor devices and methods of manufacturing thereof, which substantially overcome one or more of the problems due to the limitations and disadvantages of the related art.

It is therefore a feature of an embodiment of the present invention to provide a semiconductor device that can secure a sufficient effective channel width.

It is therefore a separate feature of an embodiment of the present invention to provide a method of manufacturing a semiconductor device that can secure a sufficient effective channel width.

It is therefore a separate feature of an embodiment of the present invention to provide a semiconductor device that can secure an effective channel length and an effective channel line-width.

It is therefore a separate feature of an embodiment of the present invention to provide a method of manufacturing a semiconductor device that can secure a sufficient effective channel width and an effective line-width.

At least one of the above another features and advantages of the present invention may be realized by providing a semiconductor device including a device isolation layer disposed in a semiconductor substrate, an active region defined by the device isolation layer, the active region including a main surface and a recess region including a bottom surface that is lower than the main surface, and a gate electrode formed over the recess region, wherein a top surface of the device isolation layer adjacent to the recess region is lower than the bottom surface of the recess region.

The device isolation layer adjacent to the recess region may be recessed below a portion adjacent to the main surface of the active region. At least a portion of the active region may protrude higher than the device isolation layer. A top surface of the device isolation layer adjacent to the main surface of the active region may be lower than the main surface of the active region. The active region may extend in a row direction, and the active region protrudes higher than the device isolation layer extending adjacent to the active region along the column direction.

At least one of the above another features and advantages of the present invention may be separately realized by providing a flash memory device including a device isolation layer in a semiconductor substrate, an active region defined by the device isolation layer, the active region including a main surface and a recess region of which a bottom surface is lower than the main surface, a word line crossing over the main surface of the active region, and a selection gate line disposed in parallel with the word line, and crossing over the recess region, wherein a top surface of the device isolation layer adjacent to the recess region is lower than the bottom surface of the recess region.

The method may further include a pair of recess regions disposed in the active region, and separated from each other by a predetermined distance, a ground selection gate line and a string selection gate line crossing over the respective recess regions, and a plurality of word lines crossing over the main surface of the active region between the ground selection gate line and the string selection gate line. A charge trapping layer may be interposed between the word line and the active region, and between the selection gate line and the active region.

A charge trapping layer may be interposed between the word line and the active region, and a gate insulating layer may be interposed between the selection gate line and the active region. The device may further include a tunnel insulating layer, a charge trapping layer and a blocking insulating layer, which may be sequentially stacked between the word line and the active region, wherein the word line disposed over the blocking insulating layer may include a metallic material having a work function of about 4.5 eV or greater.

The word line may include a floating gate on the active region, a control gate electrode formed on the floating gate, and crossing over the active region, and an intergate dielectric layer interposed between the floating gate and the control gate electrode, wherein a tunnel insulating layer may be interposed between the floating gate and the active region. The selection gate line may include a lower selection gate, an upper selection gate on the lower selection gate, and an intergate insulating layer interposed between the lower selection gate and the upper selection gate, the gate insulating layer may be interposed between the lower selection gate and the active region, and the lower selection gate and the upper selection gate being electrically connected to each other.

A width of the selection gate line may be greater than that of the recess region. The selection gate line may cover the active region at either side of the recess region.

At least one of the above another features and advantages of the present invention may be separately realized by providing a method for fabricating a semiconductor device, the method including forming a device isolation layer in a semiconductor substrate to define an active region having a main surface extending in a column direction, forming a hard mask having an opening exposing a portion of the active region, etching a portion of the active region using the hard mask as an etch mask to form a recess region, and etching the device isolation layer adjacent to the recess region such that a top surface of the device isolation layer may be lower than a bottom surface of the recess region. The opening may be formed such that it extends in a row direction and exposes the active region and the device isolation layer, and the device isolation layer may be etched using the hard mask as an etch mask.

Etching of the device isolation layer may be performed before or after the forming of the recess region. The method may further include etching the device isolation layer by etch-back process to make the device isolation layer lower than the main surface of the active region, and forming the recess region of which a bottom surface is higher than a top surface of the recessed device isolation layer. Etching of the device isolation layer by etch-back process may be performed before or after the forming of the recess region. The method may further include forming a word line crossing over the main surface of the active region, and a selection gate line crossing over the recess region.

BRIEF DESCRIPTION OF THE DRAWINGS

The above and other features and advantages of the present invention will become more apparent to those of ordinary skill in the art by describing in detail exemplary embodiments thereof with reference to the attached drawings, in which:

FIGS. 2A through 6A illustrate cross-sectional views of stages in a method of fabricating a semiconductor device according to a first exemplary embodiment of the present invention, taken along the first direction;

FIGS. 2B through 6B illustrate cross-sectional views of stages in a method of fabricating a semiconductor device according to the first exemplary embodiment of the present invention, taken along the second direction;

FIGS. 7A and 8A illustrate cross-sectional views of stages in a method of fabricating a semiconductor device according to a second exemplary embodiment of the present invention, taken along the first direction.

DETAILED DESCRIPTION OF THE INVENTION

Figure 1A:
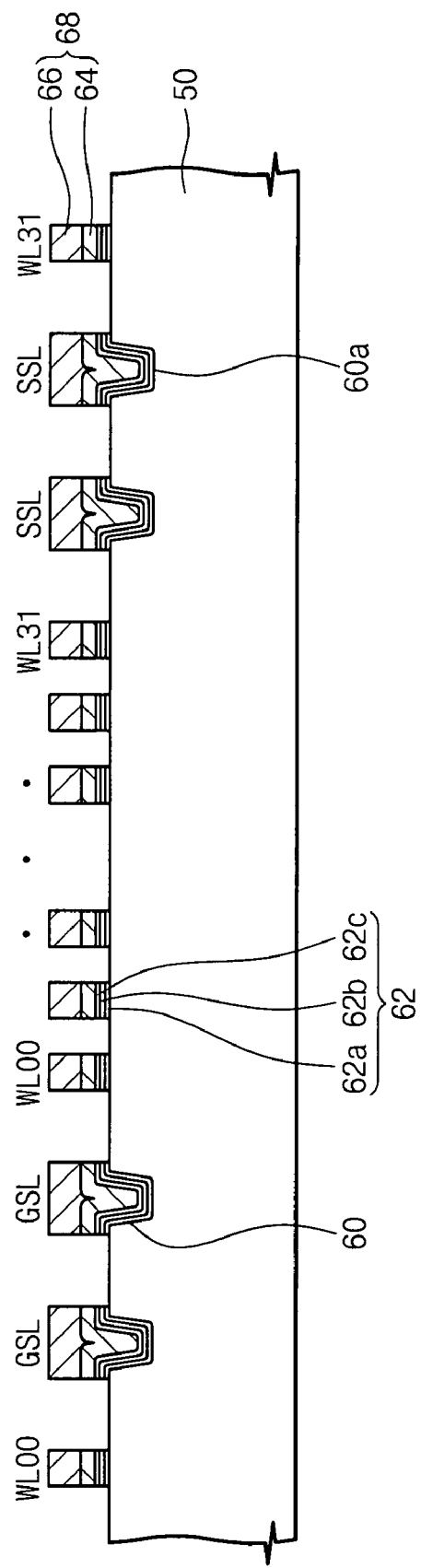
FIGS. 1A and 1B illustrate cross-sectional views of a semiconductor device according to a first exemplary embodiment of the present invention, respectively taken along a first and a second direction that is perpendicular to the first direction.

Korean Patent Application No. 2006-102566, filed on Oct. 20, 2006, in the Korean Intellectual Property Office, and entitled: "Semiconductor Device and Method of Fabricating the Same," is incorporated by reference herein in its entirety.

The present invention will now be described more fully hereinafter with reference to the accompanying drawings, in which exemplary embodiments of the invention are illustrated. The invention may, however, be embodied in different forms and should not be construed as limited to the embodiments set forth herein. Rather, these embodiments are provided so that this disclosure will be thorough and complete, and will fully convey the scope of the invention to those skilled in the art.

In the figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout the specification.

Hereinafter, exemplary embodiments of the invention will be described with reference to the accompanying figures.

Figure 1B:
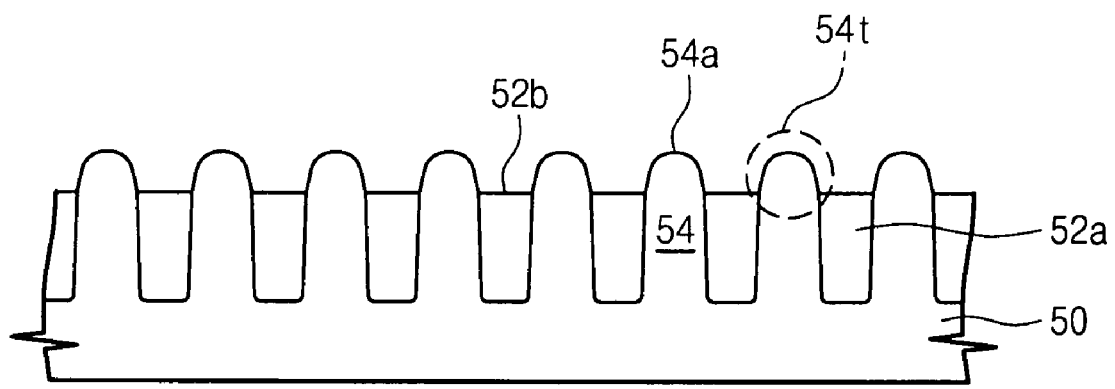

FIGS. 1A and 1B illustrate cross-sectional views of a semiconductor device according to a first exemplary embodiment of the present invention, respectively taken along a first and a second direction that is perpendicular to the first direction.

Referring to FIGS. 1A and 1B, a device isolation pattern 52a may be formed in a semiconductor substrate 50 to define an active region 54. A main surface region 54a of the active region 54 defined, e.g., by two adjacent device isolation patterns 52a, may extend along the first direction, e.g., a column direction, and recess region(s) 60 may be formed in a predetermined region of the active region 54. In a NAND flash memory device, the recess region 60 may correspond to a region where a gate electrode of a selection transistor is formed.

A ground selection line GSL and a string selection line SSL may cross over the active region 54, may extend parallel to each other, and may be separated from each other by a predetermined distance. A plurality of word lines WLn may be parallel to and disposed between the ground selection line GSL and the string selection line SSL. The active regions 54 under the ground selection line GSL and the string selection line SSL may correspond to the recess regions 60. The recess regions 60 may include a bottom surface 60a that may be lower than the main surface 54a of the active region 54. In embodiments of the invention, a width of the recess region 60 may be smaller than a width of the string and/or ground selection lines SSL and GSL. The string selection line SSL and the ground selection line GSL may overlap the active region 54 beyond the recess region 60.

Referring to FIGS. 1A and 1B, an upper surface 52b of the device isolation pattern 52a disposed adjacent to the recess region 60 may be lower than the bottom surface 60a of the recess region 60. In some embodiments of the invention, the active region 54 may include a protruding upper portion 54t that protrudes upward beyond the upper surface 52b of the device isolation pattern 52a. More particularly, e.g., in some embodiments of the invention, when observing a cross-sectional of the selection transistors taken along a direction parallel to the ground or string selection line GSL or SSL, the main surface 54a of the active region 54, corresponding to the protruding upper portion 54t, may have a rounded, sloped or curved shape. For example, the protruded upper portion 54t of the active region 54 may have a hemispherical-like, trapezoidal-like, or cone-like cross-sectional shape as a result of etching conditions.

In a charge trap type flash memory device, the word line WLn may include a cell gate electrode 68 and a cell gate insulating layer 62. The cell gate insulating layer 62 may be interposed between the semiconductor substrate 50 and the cell gate electrode 68. The cell gate insulating layer 62 may be configured with a tunnel insulating layer 62a, a charge trapping layer 62b, and a blocking insulating layer 62c, which may be stacked in sequence. The ground and string selection lines GSL and SSL may have the same stack structure as the word line WLn. For example, the ground and string selection lines GSL and SSL may include a selection gate electrode 68 and a selection gate insulating layer interposed between the semiconductor substrate 50 and the selection gate electrode 68. The selection gate insulating layer may have the same stack structure as the cell gate insulating layer 62. That is, the selection gate insulating layer may be configured with a tunnel insulating layer 62a, a charge trapping layer 62b, and a blocking insulating layer 62c. In other embodiments of the invention, e.g., the selection gate insulating layer may be configured with a monolayer as a gate insulating layer.

A channel region of a memory cell transistor may be formed in the active region 54 under the word line WLn. A channel region of the ground selection line GSL may be formed in the active region 54 under the ground selection line GSL, and a channel region of the string selection line SSL may be formed in the active region 54 under the string selection line SSL. In embodiments of the present invention, the channel regions of the ground and string selection lines GSL and SSL may be formed in the recess regions 60 so that they may have a larger effective channel length than the widths of the ground and string selection lines GSL and SSL.

In some embodiments of the invention, because the bottom surface 60a of the recess region 60 may be higher than the upper surface 52b of the device isolation pattern 52a adjacent thereto, the channel regions of the ground and string selection lines GSL and SSL may be formed along the protruding upper portion 54t of the active region 54. Thus, an effective channel width may be increased, and may be greater than the width of the active region 54. The gate insulating layers of the ground and string selection lines GSL and SSL may be formed such that they cover the protruding upper portion 54t of the active region 54. More particularly, the gate insulating layers of the ground and string selection lines GSL and SSL may be formed such that they surround sidewalls of the protruded upper portion 54t as well as the main surface 54a of the active region can 54. In such embodiments, the main surface 54a and portions of the sidewalls of the protruding upper portion 54t may be correspond to the channel region.

In conventional devices, when, e.g., the gate insulating layer has a thickness of 20 nm, and an active region has a line-width of 40 nm, the gate insulating layer may fill the recess region. Thus, in such conventional devices, controllability of a gate of the transistor may be hindered. In embodiments of the present invention, however, the recess region 60 may be formed so as to ensure that the recess region 60 may not be completely filled with the gate insulating layer. More particularly, in some embodiments of the invention, by providing the protruding upper portion 54t of the active region 54, respective portions of the protruding upper portion 54t may be used as the channel region of the transistor.

In embodiments of the present invention, the blocking insulating layer 62c may have a higher dielectric constant than a dielectric constant of the tunnel insulating layer 62a. The cell gate electrode 68 may include a metallic material having a work function greater than about 4.5 eV, wherein the metallic material may be in contact with the blocking insulating layer 62c. For example, in some embodiments of the invention, the cell gate electrode 68 may include a barrier metal layer 64, e.g., a tantalum nitride layer, with a metal layer 66 having excellent conductivity, e.g., a tungsten and/or a tungsten nitride layer, formed on the barrier metal layer 64.

Figure 2B:
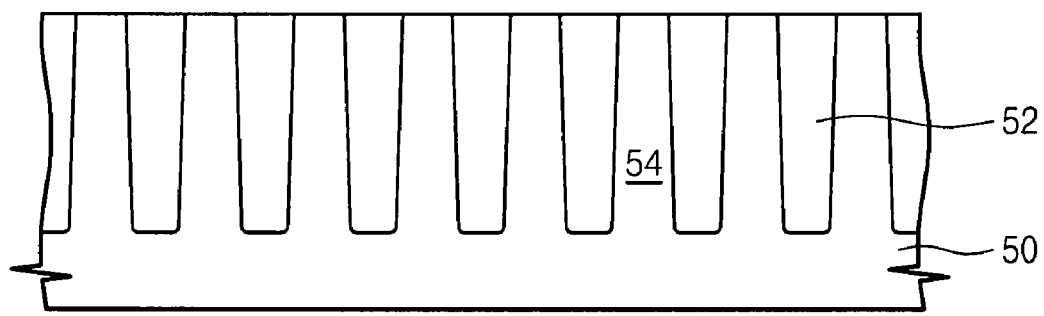
Figure 6A:
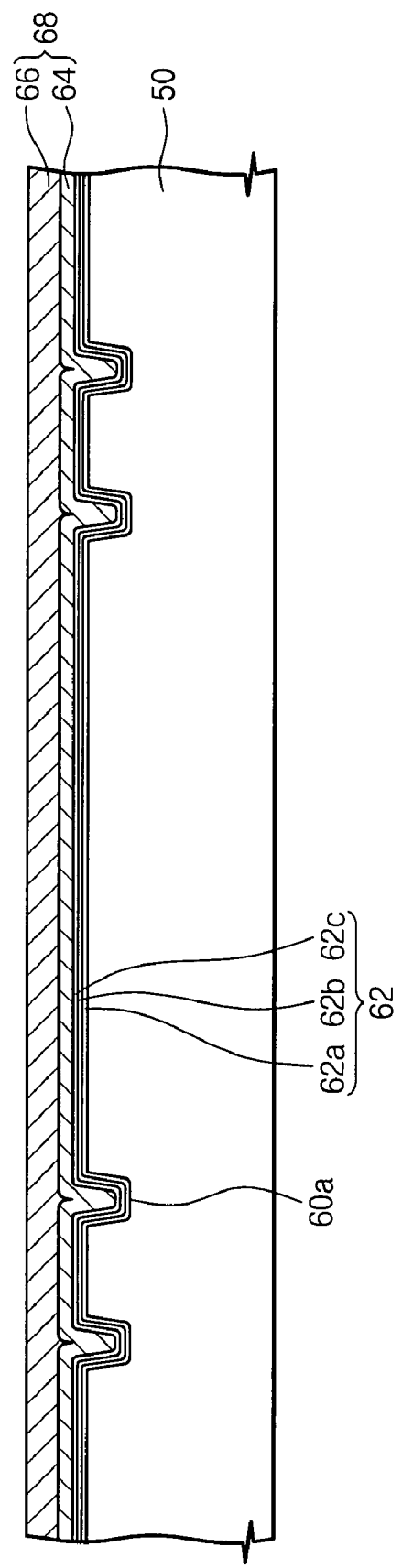
Figure 6B:
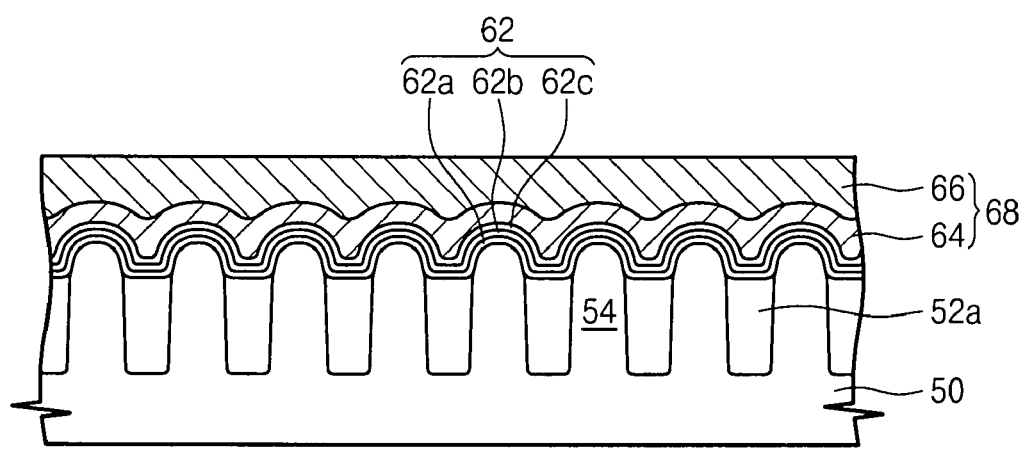

FIGS. 2B and 6B illustrate cross-sectional views of stages in a method of fabricating a semiconductor device according to the first exemplary embodiment of the present invention, taken along the second direction.

Referring to FIGS. 2A and 2B, a device isolation layer 52 may be formed in a semiconductor substrate 50. The device isolation layer 52 may define the active region 54. The device isolation layer 54 may be formed using a shallow trench isolation (STI) technique.

The main surface 54a of the active region 54 may extend along the first direction, e.g., a column direction. In embodiments of the invention, the active regions 54 may be disposed to extend along the first direction, i.e., substantially perpendicular to the first direction along which the gate and/or string selection lines GSL, SSL may extend.

Figure 3A:
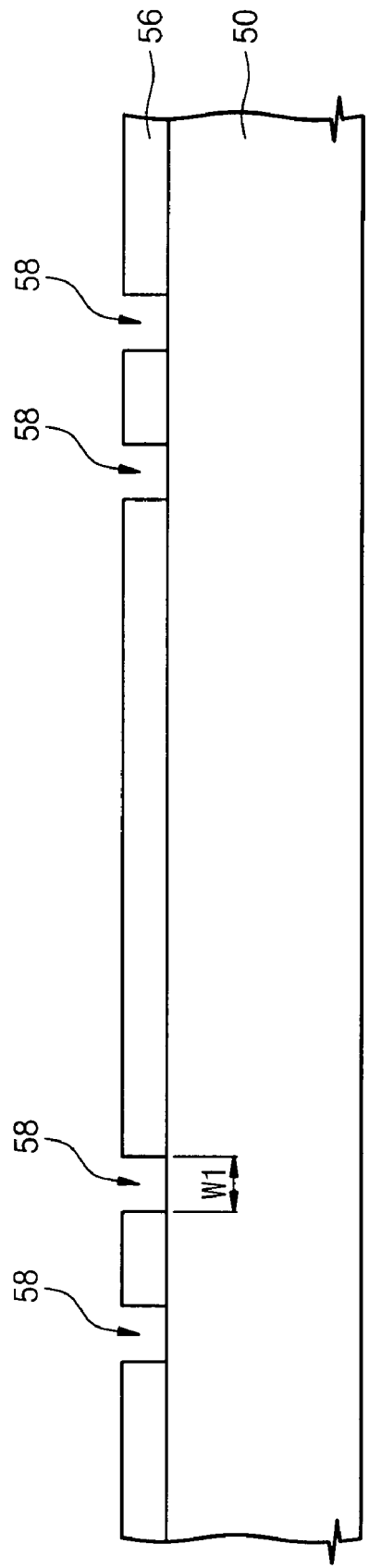
Figure 3B:
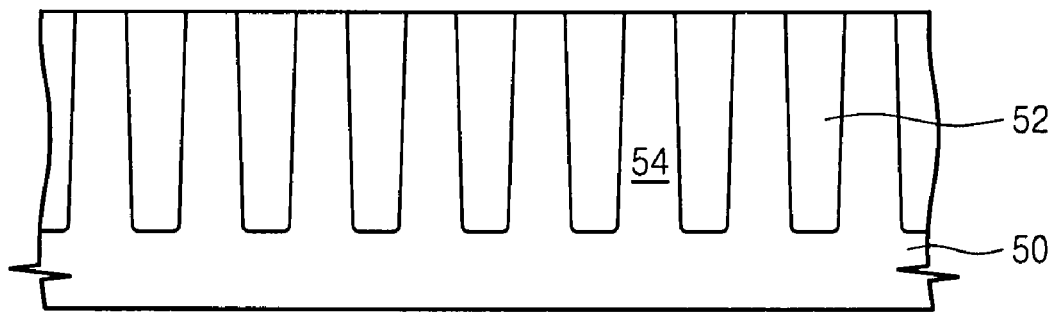

Referring to FIGS. 3A and 3B, a hard mask 56 may be formed on the resultant structure. The hard mask 56 may have an opening 58 exposing a portion of the active region 54. The opening 58 may extend in the second direction intersecting the active regions 54 and may expose the device isolation layer 52 defining the active regions 54 as well as the active regions 54.

In some embodiments of the invention, the opening 58 may be placed over a region where a channel of the selection transistor will be formed in the NAND type cell array, and may have a smaller width W1 than that of the gate line of the select transistor.

Figure 4B:
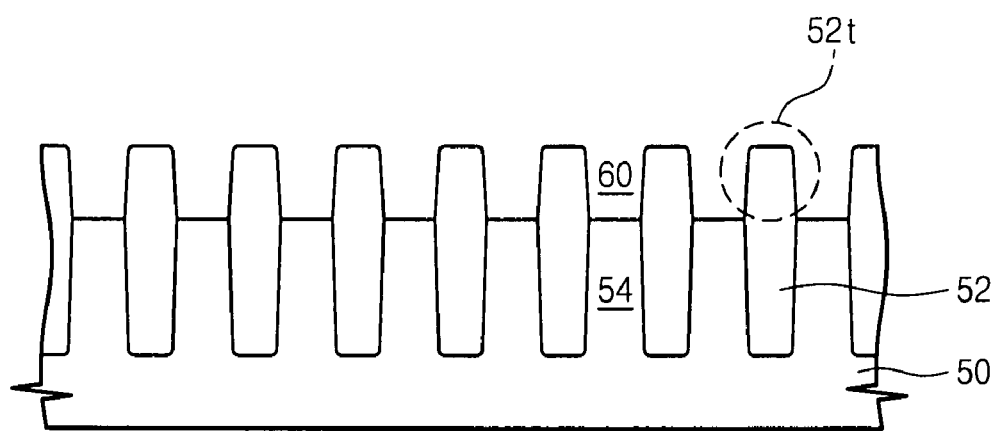

Referring to FIGS. 4A and 4B, the active region 54 may be etched to form the recess region 60 using the hard mask 56 as an etch mask. The bottom surface 60a of the recess region 60 may be positioned lower than the main surface 54a of the active region. Therefore, the device isolation layer 52 adjacent to the recess region 60 may include a protrusion 52t that may be higher than the bottom surface 60a of the recess region 60.

Figure 5A:
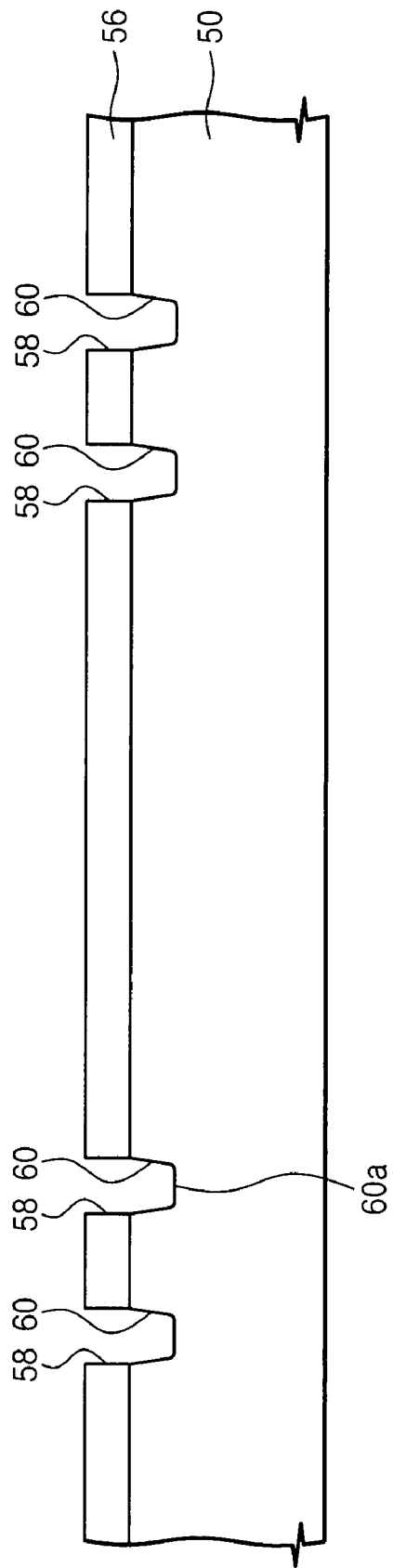
Figure 5B:
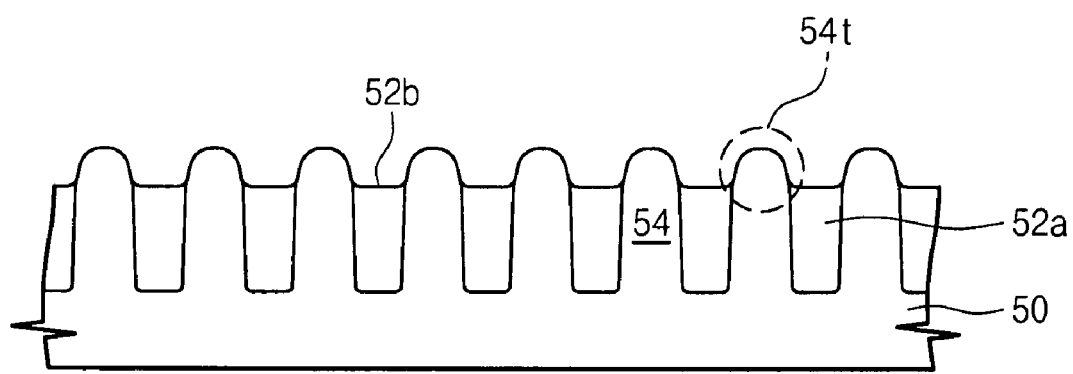

Referring to FIGS. 5A and 5B, the device isolation layer 52 may then be etched using the hard mask 56 as an etch mask. In some embodiments of the invention, the hard mask 56 may be etched using a different etching solution than that used to etch the active region 54. Thus, the protrusions 52t of the device isolation layer 52 adjacent to the recess region 60 may be etched such the device isolation pattern 52b may be formed. More particularly, the upper surface 52a of the device isolation pattern 52a may be lower than the bottom surface 60a of the recess region 60. Thus, the active region 54 may include protruded upper portion(s) 54t, which may be higher than the upper surface 52b of the device isolation pattern 52a. The protruded upper portion 54t of the active region 54 may have a hemispherical-like, trapezoidal-like, or cone-like cross-sectional shape as a result of the etching conditions.

Thus, because the active region 54 may include the recess region 60 having the bottom surface 60a that may be lower than the main surface 54a of the active region 54, and the device isolation pattern 52a adjacent to the recess region 60 may be lower than the bottom surface 60a of the recess region 60, sidewalls of the active region 54 may be exposed at a region higher than the device isolation pattern 52s. More particularly, sidewalls of the active region 54 may be exposed at a region higher than the upper surface 52a of the device isolation pattern 52b.

In embodiments of the invention, the device isolation layer 52 may be etched using the hard mask 56 as an etch mask and thus, only the device isolation layer 52 adjacent to the recess region 60 may be etched, i.e., shortened to become lower than the active region 54.

Alternatively, the device isolation layer 52 may be etched over an entire surface of the cell array region by an etch-back process after removing the hard mask layer 56, whereby the device isolation layer 52 adjacent to the main surface of the active region 54 may be lower than the active region 54. In such cases, because the device isolation layer 52 may be etched to be lower than the bottom surface 60a of the recess region 60, the upper surface 52b of the device isolation pattern 52a adjacent to the recess region 60 may be lower than the bottom surface 60a of the recess region 60.

Alternatively, it is possible to provide the device isolation layer 52 at a level lower than the recess region 60 by etching the device isolation layer 52 before forming the recess region 60. That is, after etching the device isolation layer 52 using the hard mask 56 as an etch mask, the active region 54 may be etched using the hard mask 56 as an etch mask. Before forming the hard mask 56, the device isolation layer 52 may be etched in the cell array so that the upper surface 52b of the device isolation layer 52 becomes lower than the main surface 54a of the active region 54. Thereafter, the hard mask 56 may be formed, and the recess region 60 may then be formed using the hard mask 56.

When the top surface of the device isolation layer 52 is lower than the main surface of the active region 54, the active region 54 may have a protrusion that is higher than the device isolation layer 52. That is, the active region 54 may have a sidewall or portion extending from the main surface 54a thereof that is higher than, i.e., protruding, relative to the upper surface 52b of the device isolation pattern 52a. As a result, the channel width of the cell transistor can be increased because the channel of the cell transistor can be formed on the main surface 54a and/or protruding sidewall of the active region 54.

Referring to FIGS. 6A and 6B, the hard mask 56 may be removed and the gate insulating layer 62 may then formed on a surface, e.g., an entire surface, of the active region 54. In charge trap type flash memory devices, the gate insulating layer 62 may have a multi-stacked structure including a charge trapping layer. For example, the gate insulating layer 62 may include the tunnel insulating layer 62a, the charge trapping layer 62b and the blocking insulating layer 62c.

The gate electrode layer 68 may then be formed on the gate insulating layer 62. The gate electrode layer 68 may include the barrier metal layer 64 formed of a metallic material having a work function of about 4.5 eV or greater. For example, the barrier metal layer 64 may include tantalum nitride.

The metal layer 66 with excellent conductivity may then be formed on the barrier metal layer 64. The metal layer 66 may be formed of tungsten and/or tungsten nitride layer. Subsequently, as shown in FIGS. 1A and 1B, at least the gate electrode layer 68 may be patterned to form a plurality of word lines WLn crossing over the active region 54, and ground and string section lines GSL and SSL crossing over the recess region 60.

More particularly with regard to the gate insulating layer 62, in embodiments of the invention, the gate insulating layer 62 may be conformally formed along a surface profile of the recess region 60. In conventional devices, when the minimum width is reduced so that the width of the active region 54 is two times or less the thickness of the gate insulating layer 62, the recess region 60 was filled with the gate insulating layer.

In embodiments of the present invention, however, because the recess region 60 may include the bottom surface 60a that is higher than the upper surface 52b of the device isolation pattern 52a, the recess region 60 may not be filled with the gate insulating layer 62. Thus, embodiments of the invention may be advantageous over conventional devices at least because embodiments of the invention provide the active region 54 and the recess region 60 such that the recess region 60 may not be completely filled with a gate insulating layer formed thereon. Rather, in embodiments of the invention, the gate insulating layer 62 may be formed so as to encompass the bottom surface 60a of the recess region 60, and thus a contact area between the active region 54 and the gate insulating layer 62 may be enlarged. Therefore, it is possible to increase the channel width of the selection transistor defined in the active region under the ground and string selection lines GSL and SSL.

In the above description of exemplary embodiments, the gate insulating layer 62 is illustrated as having a multi-stacked structure all over the active region. However, embodiments of the invention are not limited to such a structure. For example, the gate insulating layer 62 may have a multi-stacked structure in a region where the word lines are formed, but may have a monolayer structure in a region where the ground and string selection lines GSL and SSL are formed. In such embodiments, after forming a multi-layered gate insulating layer 62, the multi-layered gate insulating layer 62 may be partially removed to form a monolayered gate insulating layer.

Figure 7B:
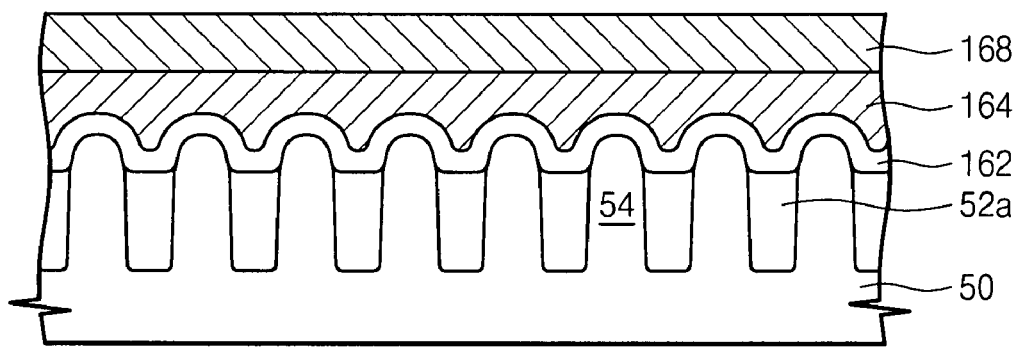
FIGS. 7B and 8B illustrate cross-sectional views of stages in a method of fabricating a semiconductor device according to the second exemplary embodiment of the present invention, taken along the second direction.
Figure 8B:
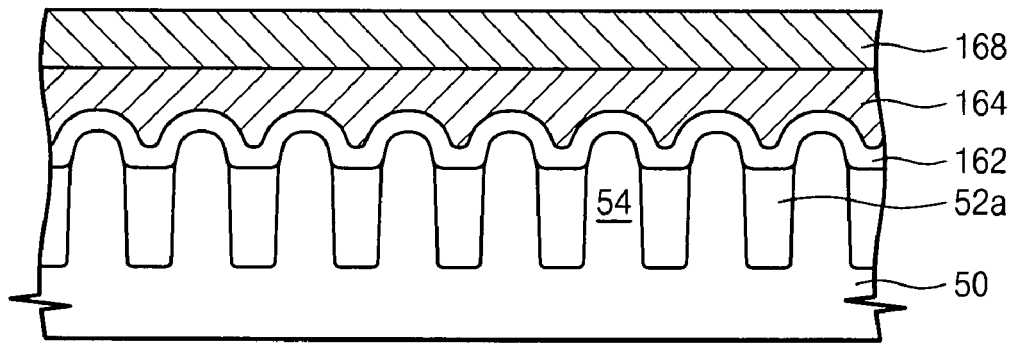

FIGS. 7A and 8A illustrate cross-sectional views of stages in a method of fabricating a semiconductor device according to a second exemplary embodiment of the present invention, taken along the first direction. FIGS. 7B and 8B illustrate cross-sectional views of stages in a method of fabricating a semiconductor device according to the second exemplary embodiment of the present invention, taken along the second direction.

Referring to FIGS. 7A and 7B, a floating gate type flash memory device may include a floating gate. In the following description, in general, only differences between the first exemplary embodiment described above and the second exemplary embodiment illustrated in FIGS. 7A through 8B will be described. Similar to the exemplary process described above with reference to FIGS. 5A and 5B, the recess region 60 may be formed in the active region 54, and at least the device isolation pattern 52a adjacent to the recess region 60 may be etched to have a top surface thereof lower than the bottom surface 60a of the recess region 60.

Afterwards, a gate insulating layer 162 may be formed on the active region 54, and a floating gate layer 164, an intergate dielectric layer 166, and a control gate electrode layer 168 may be formed on the gate insulating layer 162. In some embodiments of the invention, the intergate dielectric layer 166 may be formed such that it has an opening 0x over the recess region 60, so that the floating gate layer 164 and the control gate electrode layer 168 may be connected to each other.

The gate insulating layer 162 may be a thin tunnel insulating layer at a portion where the cell transistor will be formed, whereas it may be thicker than the tunnel insulating layer at a portion where the selection transistor will be formed.

Referring to FIGS. 8A and 8B, the control gate electrode layer 168, the intergate dielectric layer 166 and the floating gate layer 164 may be sequentially patterned to form word lines WLn crossing over the active region 54 and the ground and selection lines GSL and SSL crossing over the recess region 60.

The word line WLn may have a multi-stacked structure in which the floating gate layer 164, the intergate dielectric layer 166 and the control gate layer 168 are stacked over the tunnel insulating layer 162 in sequence. Each of the ground and string selection lines GSL and SSL may include a lower selection gate corresponding to the floating gate 164, an intergate insulating layer corresponding to the intergate dielectric layer 166, and an upper selection gate corresponding to the control gate electrode 168.

Embodiments of the present invention enable an effective channel width as well as an effective channel length of a transistor, including a channel formed in the recess region, to be secured. When one or more aspects of the present invention is applied to the flash memory device, it is possible to provide a selection transistor having a larger effective channel length than a gate linewidth. In addition, even if the minimum linewidth is reduced, embodiments of the invention enable suppression and/or prevention of degradation of gate controllability for the channel while securing the effective channel width as well.

Furthermore, when forming an active region where a cell transistor will be formed such that it protrudes higher than a device isolation layer, a channel width of the cell transistor can be increased.

Exemplary embodiments of the present invention have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A flash memory device, comprising:
   a device isolation layer in a semiconductor substrate;
   an active region defined by the device isolation layer, the active region including a main surface and a pair of recess regions of which a bottom surface is lower than the main surface, the pair of recess regions being disposed in the active region and separated from each other by a predetermined distance;
   a ground selection gate line and a string selection gate line crossing over the respective pair of recess regions; and
   at least one word line crossing over the main surface of the active region between the ground selection gate line and the string selection gate line,
   wherein a top surface of the device isolation layer adjacent to the pair of recess regions is lower than the bottom surface of the pair of the recess regions.

2. The flash memory device as claimed in claim 1, wherein a charge trapping layer is interposed between the word line and the active region, and between the active region and a selection gate line including the ground selection gate line and the string selection gate line.

3. The flash memory device as claimed in claim 1, wherein a charge trapping layer is interposed between the word line and the active region, and a gate insulating layer is interposed between the active region and a selection gate line including the ground selection gate line and the string selection gate line.

4. The flash memory device as claimed in claim 1, further comprising a tunnel insulating layer, a charge trapping layer, and a blocking insulating layer, which are sequentially stacked between the word line and the active region,
   wherein the word line disposed over the blocking insulating layer includes a metallic material having a work function of about 4.5 eV or greater.

5. The flash memory device as claimed in claim 1, wherein the word line comprises:
   a floating gate on the active region;
   a control gate electrode formed on the floating gate, and crossing over the active region; and
   an intergate dielectric layer interposed between the floating gate and the control gate electrode,
   wherein a tunnel insulating layer is interposed between the floating gate and the active region.

6. The flash memory device as claimed in claim 1, wherein the ground selection gate line and the string selection gate line comprise:
   a lower selection gate;
   an upper selection gate on the lower selection gate; and
   an intergate insulating layer interposed between the lower selection gate and the upper selection gate,
   the gate insulating layer being interposed between the lower selection gate and the active region, and the lower selection gate and the upper selection gate being electrically connected to each other.

7. The flash memory device as claimed in claim 1, wherein widths of the ground selection gate line and the string selection gate line are greater than that of the recess regions.

8. The flash memory device as claimed in claim 7, wherein the ground selection gate line and the string selection gate line cover the active region at either side of the respective pair of recess regions.

9. A method for fabricating a semiconductor device, the method comprising:
   forming a device isolation layer in a semiconductor substrate to define an active region having a main surface and a pair of recess regions of which a bottom surface is lower than the main surface, the pair of recess regions being disposed in the active region and separated from each other by a predetermined distance,
   the device isolation layer adjacent to the pair of recess regions being etched such that a top surface of the device isolation layer is lower than a bottom surface of the pair of recess regions;
   forming a ground selection gate line and a string selection gate line crossing over the respective pair of recess regions; and
   forming at least one word line crossing over the main surface of the active region between the ground selection gate line and the string selection gate line.

10. The method as claimed in claim 9, wherein forming the pair of recess regions includes:

forming a hard mask having an opening exposing a portion of the active region; and etching a portion of the active region using the hard mask as an etch mask to form the pair of recess regions, wherein the opening is formed such that it extends in a row direction and exposes the active region and the device isolation layer, and the device isolation layer is etched using the hard mask as the etch mask.

11. The method as claimed in claim 10, wherein etching of the device isolation layer is performed before or after the forming of the pair of recess regions.

12. The method as claimed in claim 9, further comprising:

etching the device isolation layer by etch-back process to make the device isolation layer lower than the main surface of the active region; and forming the recess region of which a bottom surface is higher than a top surface of the recessed device isolation layer.

13. The method as claimed in claim 12, wherein the etching of the device isolation layer by etch-back process is performed before or after the forming of the pair of recess regions.

* * * * *